US011239442B2

(12) United States Patent
Zang et al.

(10) Patent No.: US 11,239,442 B2
(45) Date of Patent: Feb. 1, 2022

(54) DISPLAY PANEL AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Dandan Zang, Beijing (CN); Xinwei Gao, Beijing (CN); Peng Li, Beijing (CN); Wentong Huang, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 88 days.

(21) Appl. No.: 16/649,531

(22) PCT Filed: Jun. 6, 2019

(86) PCT No.: PCT/CN2019/090394
§ 371 (c)(1),
(2) Date: Mar. 20, 2020

(87) PCT Pub. No.: WO2019/233479
PCT Pub. Date: Dec. 12, 2019

(65) Prior Publication Data
US 2020/0313113 A1 Oct. 1, 2020

(30) Foreign Application Priority Data
Jun. 7, 2018 (CN) .......................... 201810581147.2

(51) Int. Cl.
H01L 51/52 (2006.01)
H01L 27/32 (2006.01)

(52) U.S. Cl.
CPC ........ *H01L 51/5228* (2013.01); *H01L 27/322* (2013.01); *H01L 27/3246* (2013.01); *H01L 51/525* (2013.01); *H01L 51/5234* (2013.01)

(58) Field of Classification Search
CPC .......................... H01L 51/5228; H01L 51/525
See application file for complete search history.

(56) References Cited

U.S. PATENT DOCUMENTS

2004/0140760 A1   7/2004  Chang et al.
2015/0111449 A1*  4/2015  Cruz-Silva ................ D01F 9/12
                                                                442/153

(Continued)

FOREIGN PATENT DOCUMENTS

CN   103972270 A   8/2014
CN   106773205 A   5/2017

(Continued)

OTHER PUBLICATIONS

Notification of Refusal issued in corresponding Chinese Application No. 201810581147.2, dated Aug. 25, 2020, with English language translation.

(Continued)

*Primary Examiner* — Daniel P Shook
(74) *Attorney, Agent, or Firm* — McDermott Will and Emery LLP

(57) ABSTRACT

A display panel includes a base substrate including a first surface; another base substrate including a second surface disposed face the first surface; a first insulating layer disposed above the first surface of the base substrate, a plurality of grooves being disposed in a surface of the first insulating layer away from the base substrate; a first conductive layer disposed at a side of the first insulating layer away from the base substrate, the first conductive layer at least covering bottom faces and side walls of the plurality of grooves; a plurality of support portions disposed above the second (Continued)

surface of the another base substrate; and a second conductive layer disposed at a side of the plurality of support portions away from the another base substrate, the second conductive layer at least covering surfaces of the plurality of support portions facing away from the another base substrate and side faces of the plurality of support portions. Each support portion is embedded into a respective one of the plurality of grooves, and the first conductive layer is in electrical contact with the second conductive layer at the bottom faces and side walls of the plurality of grooves.

17 Claims, 9 Drawing Sheets

(56) References Cited

U.S. PATENT DOCUMENTS

2016/0181566 A1* 6/2016 Wang .................. H01L 51/525
257/40

2019/0004351 A1 1/2019 Cao et al.

FOREIGN PATENT DOCUMENTS

| CN | 207199626 U | 4/2018 |
|---|---|---|
| CN | 108110037 A | 6/2018 |
| CN | 108511507 A | 9/2018 |
| KR | 10-2007-0067502 A | 6/2007 |

OTHER PUBLICATIONS

Second Office Action issued in corresponding Chinese Application No. 201810581147.2, dated Mar. 25, 2020, with English language translation.

First Office Action issued in corresponding Chinese Application No. 201810581147.2, dated Sep. 25, 2019, with English language translation.

* cited by examiner

DISPLAY PANEL AND DISPLAY DEVICE

CROSS-REFERENCE TO RELATED APPLICATIONS

This application is a national phase entry under 35 USC 371 of International Patent Application No. PCT/CN2019/090394 filed on Jun. 6, 2019, which claims priority to and benefits of Chinese Patent Application No. 201810581147.2, filed with the Chinese Patent Office on Jun. 7, 2018, titled "A DISPLAY PANEL AND DISPLAY DEVICE", which are incorporated herein by reference in their entirety.

TECHNICAL FIELD

The present disclosure relates to the field of display technologies, and in particular, to a display panel and a display device.

BACKGROUND

A cathode layer of a bottom-emitting organic light-emitting diode (OLED) display device is usually formed to be very thick. However, the bottom-emitting OLED display device is limited by an aperture ratio of a pixel, and thus it is difficult to achieve a high-resolution display. A top-emitting OLED display device is not or little limited by the aperture ratio of the pixel, and thus the high-resolution display may be achieved. A cathode layer of the top-emitting OLED display device is formed to be thinner than the cathode layer of the bottom-emitting OLED display device.

SUMMARY

In one aspect, a display panel is provided. The display panel includes: a base substrate including a first surface, another base substrate including a second surface disposed face the first surface, a first insulating layer disposed above the first surface of the base substrate, a first conductive layer disposed at a side of the first insulating layer away from the base substrate, a plurality of support portions disposed above the second surface of the another base substrate, and a second conductive layer disposed at a side of the plurality of support portions away from the another base substrate. A plurality of grooves are disposed in a surface of the first insulating layer away from the base substrate. The first conductive layer at least covers bottom faces and side walls of the plurality of grooves. The second conductive layer at least covers surfaces of the plurality of support portions facing away from the another base substrate and side faces of the plurality of support portions. Each support portion is embedded into a respective one of the plurality of grooves, and the first conductive layer is in electrical contact with the second conductive layer at the bottom faces and side walls of the plurality of grooves. In some embodiments, the display panel further includes a second insulating layer disposed between the plurality of support portions and the another base substrate.

In some embodiments, one of the first conductive layer and the second conductive layer is a transmissive electrode layer, and another one of the first conductive layer and the second conductive layer is an auxiliary electrode layer. The auxiliary electrode layer has flexibility.

In some embodiments, the auxiliary electrode layer includes at least one first sub-layer and at least one second sub-layer that are disposed in a stack. In the at least one first sub-layer and the at least one second sub-layer, a sub-layer farthest from a base substrate where the auxiliary electrode layer is located is a second sub-layer. A material of the at least one first sub-layer includes a conductive material, and a material of the at least one second sub-layer includes a flexible conductive material.

In some embodiments, the at least one first sub-layer and the at least one second sub-layer are alternately stacked. In a first sub-layer and a second sub-layer that are adjacent, an orthographic projection of the first sub-layer on the another base substrate is in a range of an orthographic projection of the second sub-layer on the another base substrate. A material of each first sub-layer includes silver nanowires, and a material of each second sub-layer includes graphene oxide. Or, the material of each first sub-layer includes a composite of the silver nanowires and a transparent polymer material, and the material of each second sub-layer includes the graphene oxide. Or, the material of each first sub-layer includes a composite of the silver nanowires and the graphene oxide, and the material of each second sub-layer includes at least one of the graphene oxide or a transparent conductive polymer material.

In some embodiments, a material of the auxiliary electrode layer includes at least one of silver nanowires, graphene, graphene oxide, a composite of the silver nanowires and a transparent polymer material, a composite of the silver nanowires and the graphene oxide, or a transparent conductive polymer material.

In some embodiments, the display panel has a plurality of open regions and a non-open region. The auxiliary electrode layer is disposed in the plurality of open regions and the non-open region.

In some embodiments, the display panel has a plurality of open regions and a non-open region. The plurality of grooves and the plurality of support portions are disposed in the non-open region. The first conductive layer is the auxiliary electrode layer. The auxiliary electrode layer includes a plurality of auxiliary electrodes. Each of the plurality of auxiliary electrodes is disposed in a respective one of the plurality of grooves. Each auxiliary electrode at least covers a bottom face and a side wall of a corresponding groove.

In some embodiments, the display panel further includes a plurality of buffer electrodes disposed on a side of the first conductive layer of the base substrate. Each of the plurality of buffer electrodes is disposed in a respective one of the plurality of grooves. The plurality of buffer electrodes have flexibility.

In some embodiments, a material of each buffer electrode includes a conductive polymer resin material and at least one of a carbon nanomaterial or a silver nanomaterial.

In some embodiments, in a direction perpendicular to the first surface of the base substrate, a depth of each groove is less than a sum of a height of a corresponding support portion, a thickness of the second conductive layer and a thickness of the first conductive layer.

In some embodiments, the depth of each groove ranges from 0.5 times to 0.8 times the sum of the height of the corresponding support portion, the thickness of the second conductive layer and the thickness of the first conductive layer.

In some embodiments, a width of each groove is gradually increased in a direction perpendicular to the first surface and pointing from the first surface to the second surface. The width of each groove is a size of the groove in a direction parallel to the first surface. A shape and a size of a portion of each support portion embedded into a corresponding groove are matched with a shape and a size of the corresponding groove, respectively.

In some embodiments, a cross-section of each groove has a shape of a trapezoid or a semicircle in a direction perpendicular to the first surface.

In some embodiments, the first insulating layer is a pixel defining layer, and the first conductive layer is a transmissive electrode layer. The second insulating layer is a transparent adhesive layer, and the second conductive layer is an auxiliary electrode layer. Alternatively, the second insulating layer is a pixel defining layer, and the second conductive layer is a transmissive electrode layer; and the first insulating layer is a transparent adhesive layer, and the first conductive layer is an auxiliary electrode layer.

In another aspect, a method for manufacturing a display panel, which is configured to manufacture the above display panel, is provided. The manufacturing method includes: providing two base substrates; forming a first insulating layer at a side of one base substrate of the two base substrates; forming a plurality of grooves in a surface of the first insulating layer away from the base substrate; and forming a first conductive layer at a side of the first insulating layer away from the base substrate, the conductive layer at least covering bottom faces and side walls of the plurality of grooves to form a substrate; and forming a plurality of support portions at a side of another base substrate of the two base substrate; forming another conductive layer at a side of the plurality of support portions away from the another base substrate, the another conductive layer at least covering surfaces of the plurality of support portions facing away from the another base substrate and side faces of the plurality of support portions to form another substrate; and placing the two substrates opposite to each other and bonding the two substrates together, such that each of the plurality of support portions is embedded into a respective one of the plurality of grooves. In some embodiments, before forming the plurality of support portions at a side of another base substrate of the two base substrate, the method further includes: forming a second insulating layer at a side of the another base substrate where the plurality of support portion are to be formed.

In yet another aspect, a display device including the above display panel is provided.

BRIEF DESCRIPTION OF THE DRAWINGS

In order to describe technical solutions in some embodiments of the present disclosure more clearly, the accompanying drawings to be used in some embodiments of the present disclosure will be introduced briefly. Obviously, the accompanying drawings to be described below are merely some embodiments of the present disclosure, and a person of ordinary skill in the art can obtain other drawings according to those drawings.

DETAILED DESCRIPTION

Figure 1:
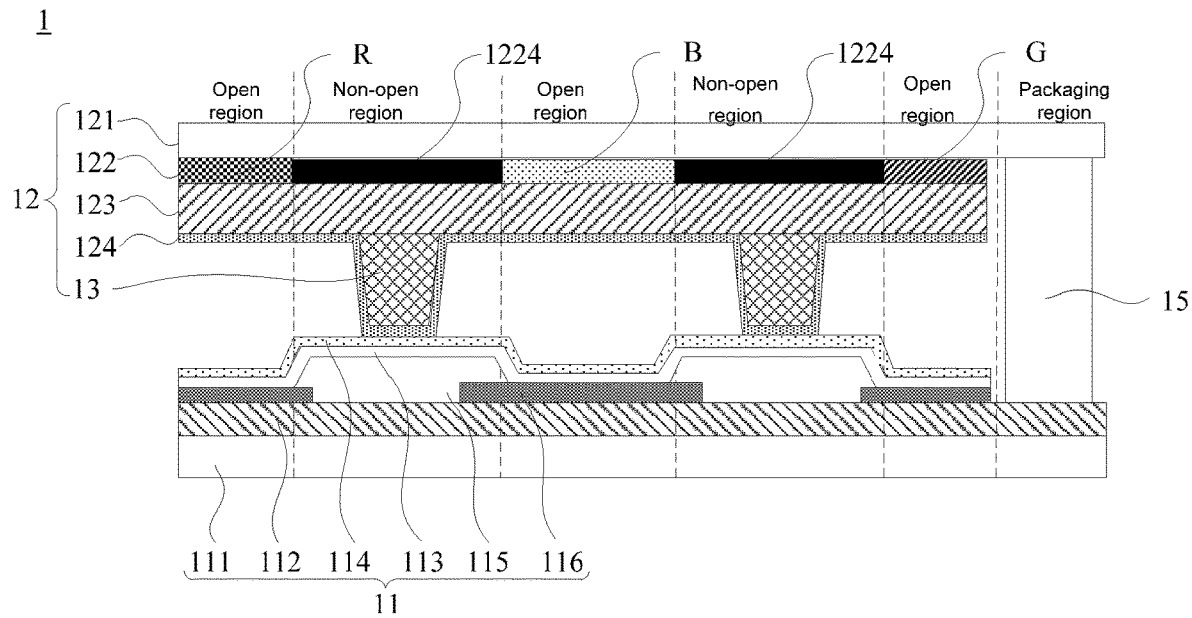
FIG. 1 is a schematic diagram showing a structure of a display panel in the related art.

The technical solutions in some embodiments of the present disclosure will be described clearly and completely in combination with the accompanying drawings in some embodiments of the present disclosure. Obviously, the described embodiments are merely some but not all of the embodiments of the present disclosure. All other embodiments obtained by a person of ordinary skill in the art based on some embodiments of the present disclosure shall be included in the protection scope of the present disclosure.

Unless otherwise defined, technical terms or scientific terms used herein shall be understood as ordinary meanings by a person of ordinary skill in the art. Words such as "first", "second" and similar words used in the description and the claims of the present disclosure are not intended to mean any order, quantity or importance, and are merely used to distinguish different components. Words such as "include", "comprise" or similar words mean that an element or an item preceding the word covers an element or an item enumerated after the word and its equivalent, without excluding other elements or items. Words such as "connect", "connection" or similar words are not limited to physical or mechanical connections, but may include electrical connections, whether direct or indirect. Words such as "upper", "lower", "left" and "right" are only used to indicate relative positional relationships. When an absolute position of the described object is changed, a relative positional relationship may also be accordingly changed.

In the related art, in order to improve a light transmittance of a top-emitting organic light-emitting diode (OLED) display device, a cathode layer of the top-emitting OLED display device is usually formed by depositing a transparent conductive material or a translucent conductive material through a sputtering process or a thermal evaporation process, and a thickness of the cathode layer is very small. However, this causes a lateral resistance of the cathode layer to be very large. Therefore, an IR drop caused by the excessive resistance of the cathode layer is also very large and exceeds a normal value, thereby causing that luminance at an edge of a screen of the display device is inconsistent with luminance in the middle of the screen of the display device. Especially in a case where a size of the screen is large, a distance between an electrode interface at the edge and the center of the screen is large, and when a current is transmitted to the center of the screen, a voltage at the center of the screen deviates from a set voltage to a large extent, which causes a defect that the center of the screen is bright and the edge of the screen is dark.

In order to improve an IR-drop problem caused by the small thickness of the cathode layer in a large-sized OLED display device, an auxiliary electrode layer is formed on a cover plate of the OLED display device, and the auxiliary electrode layer is made electrically contact a transmissive electrode layer (i.e., the cathode layer) through support portions between the cover plate and an array substrate. The auxiliary electrode layer provided may reduce the lateral resistance of the transmissive electrode layer (i.e., the cathode layer), thereby improving the IR-drop defect caused by the small thickness of the transmissive electrode layer (i.e., the cathode layer).

For example, as shown in FIG. 1, a display panel 1 of the OLED display device includes a first substrate 11 (e.g., the array substrate) and a second substrate 12 (e.g., the cover plate) that are disposed opposite to each other. The first substrate 11 is provided with the transmissive electrode layer 114 therein, and the second substrate 12 is provided with the auxiliary electrode layer 124 therein. The second substrate 12 further includes a plurality of support portions 13. The auxiliary electrode layer 124 covers surfaces of the plurality of support portions 13. The first substrate 11 and the second substrate 12 are bonded together through a frame sealant 15. The plurality of support portions 13 are used to provide a support between the first substrate 11 and the second substrate 12, so that there is a certain gap between the first substrate 11 and the second substrate 12, and there is no contact between the first substrate 11 and the second substrate 12 when the first substrate 11 and the second substrate 12 are bonded, thereby preventing the first substrate 11 or the second substrate 12 from being damaged due to a fact that the first substrate 11 and the second substrate 12 are pressed against each other in the bonding process.

Inventors of the present disclosure have discovered through research that, in the first substrate 11 and the second substrate 12 that are bonded, portions of the auxiliary electrode layer 124 that only cover top end faces of the support portions 13 (i.e., surfaces of the support portions 13 proximate to the first substrate 11) are in electrical contact with the transmissive electrode layer 114, and areas of the top end faces of the support portions 13 are small. Therefore, a contact area between the auxiliary electrode layer 124 and the transmissive electrode layer 114 is also small. Moreover, there is a contact resistance between the auxiliary electrode layer 124 and the transmissive electrode layer 114, and thus the added auxiliary electrode layer 124 may not well solve the IR-drop problem caused by the small thickness of the transmissive electrode layer 114.

In addition, the auxiliary electrode layer 124 is made of a transparent conductive material such as indium tin oxide (ITO) or indium zinc oxide (IZO). Since the transparent conductive material has poor flexibility and is brittle, a resistance of the transparent conductive material is higher than a resistance of metal, and the contact area between the auxiliary electrode layer 124 and the transmissive electrode layer 114 is small, in the process of bonding the second substrate 12 to the first substrate 11, a very large pressure will be generated between the auxiliary electrode layer 124 and the transmissive electrode layer 114, which may cause damage to the auxiliary electrode layer 124 and/or the transmissive electrode layer 114, thereby causing a poor contact between the auxiliary electrode layer 124 and the transmissive electrode layer 114, and further weakening an effect of improving the IR-Drop detect by the auxiliary electrode layer 124.

Figure 2:
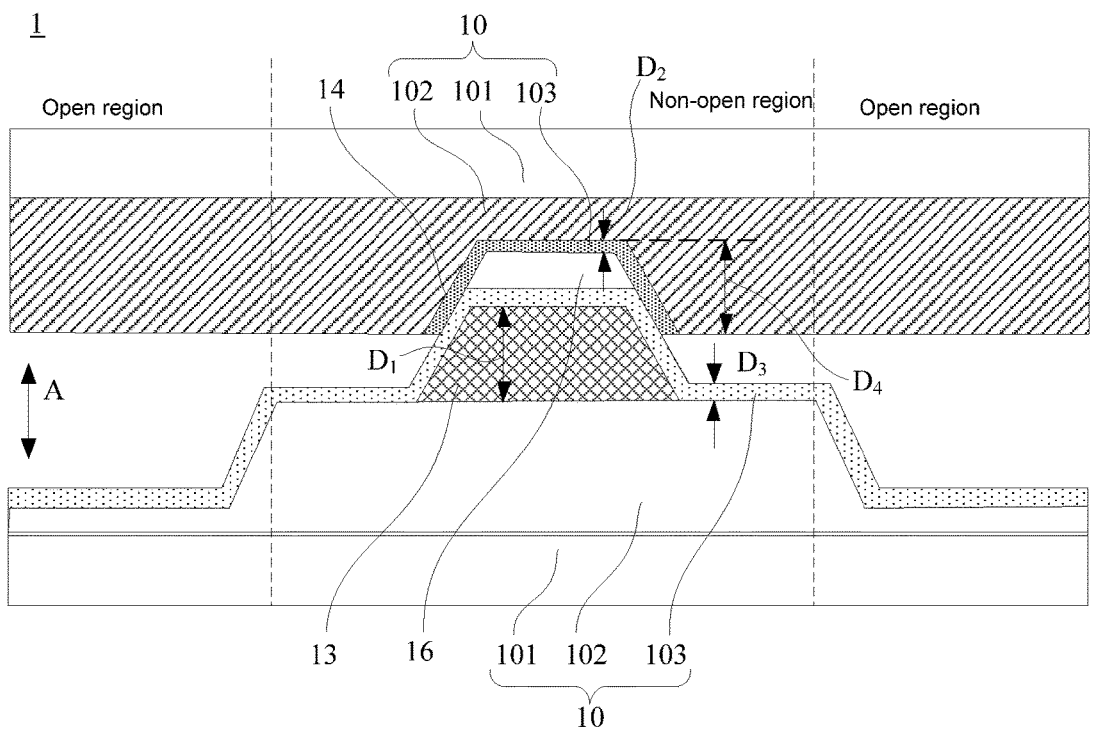
FIG. 2 is a schematic diagram showing a structure of a display panel, in accordance with some embodiments of the present disclosure.
Figure 3:
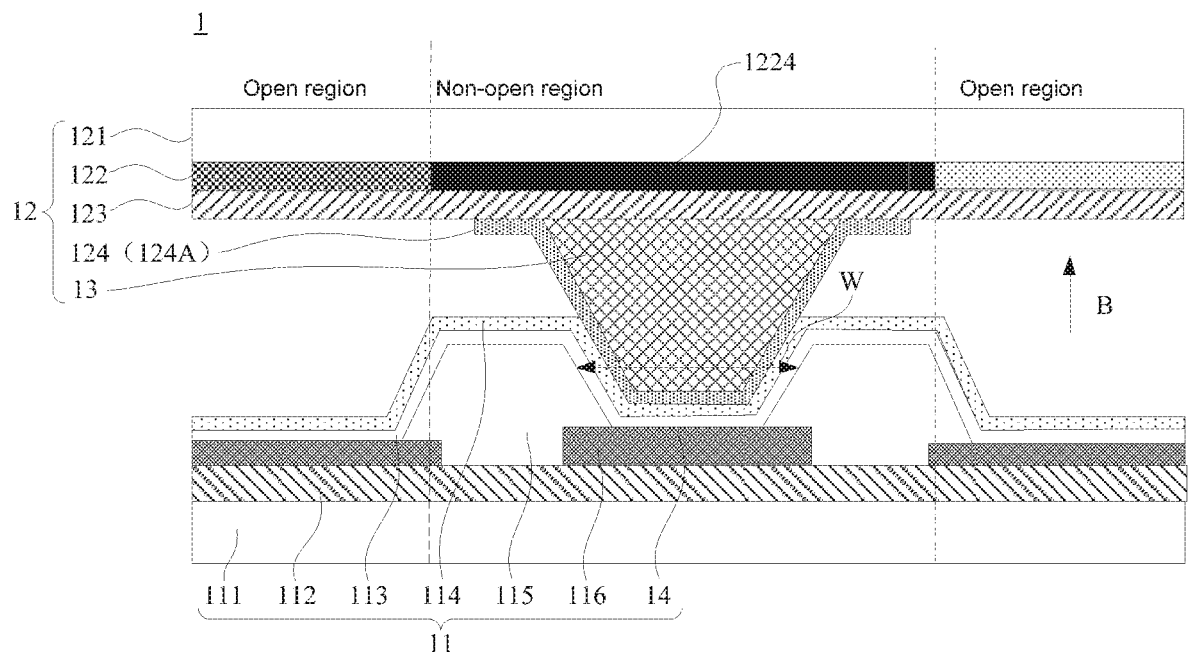
FIG. 3 is a schematic diagram showing a structure of another display panel, in accordance with some embodiments of the present disclosure.

On the basis of the above research findings, some embodiments of the present disclosure provide a display panel 1. As shown in FIG. 2, the display panel 1 includes two substrates 10 disposed opposite to each other. Each substrate 10 includes: a base substrate 101, an insulating layer 102 disposed at a side of the base substrate 101, and a conductive layer 103 disposed at a side of the insulating layer 102 away from the base substrate 101. Sides of the two substrates 10 where the insulating layers 102 and the conductive layers 103 are disposed face each other.

A surface of an insulating layer 103 of one substrate 10 of the two substrates 10 that is proximate to its opposite substrate 10 has a plurality of grooves 14, and the conductive layer 103 of the one substrate 10 at least covers bottom faces and side walls of the plurality of grooves 14. Another substrate 10 of the two substrates 10 further includes a plurality of support portions 13 disposed between the insulating layer 102 and the conductive layer 103 of the another substrate 10, and the conductive layer 103 of the another substrate 10 at least covers surfaces of ends of the plurality of support portions 13 that are proximate to its opposite substrate 10 and side faces of the plurality of support portions 13. The plurality of support portions 13 are respectively and correspondingly embedded into the plurality of grooves 14, such that the conductive layer covering the plurality of support portions 13 is in electrical contact with the conductive layer covering the plurality of grooves 14.

Here, in a direction perpendicular to a substrate to which the plurality of grooves 14 belong (shown by the direction indicator arrow A in FIG. 2), a depth $D_4$ of each groove 14 is less than a thickness of the insulating layer where the groove 14 is located, so as to prevent the groove 14 from penetrating the insulating layer where the groove 14 is located, and further prevent the conductive layer covering the groove 14 from contacting film layer(s) between the insulating layer and the base substrate.

A conductive layer 103 of one substrate 10 of the two substrates 10 is a transmissive electrode layer 114, and a conductive layer 103 of another substrate 10 is an auxiliary electrode layer 124.

On the basis of the above structure, in the display panel 1 provided by the embodiments of the present disclosure, the plurality of support portions 13 are embedded into the plurality of grooves 14 in one-to-one correspondence. Therefore, the conductive layer that at least covers the bottom face and the side wall of each groove 14 is in contact with the conductive layer that at least covers the surface of an end of each support portion 13 proximate to the opposite substrate and the side face of the support portion 13. That is, the auxiliary electrode layer 124 and the transmissive electrode layer 114 are in contact not only at the bottom face of each groove 14, but also at the side face of each groove 14. In this way, the contact area between the auxiliary electrode layer 124 and the transmissive electrode layer 114 is increased, thereby reducing the contact resistance between the transmissive electrode layer 114 and the auxiliary electrode layer 124, such that the auxiliary electrode layer 124 may well solve the IR-drop problem caused by the small thickness of the transmissive electrode layer 114.

In addition, an increase of the contact area between the transmissive electrode layer 114 and the auxiliary electrode layer 124 may also reduce the pressure between the auxiliary electrode layer 124 and the transmissive electrode layer 114, thereby reducing a probability of damage to the auxiliary electrode layer 124 and/or the transmissive electrode layer 114, avoiding a problem of poor contact between the auxiliary electrode layer 124 and the transmissive electrode layer 114 caused by the damage to the auxiliary electrode layer 124 and/or the transmissive electrode layer 114, and further strengthening the effect of improving the IR-Drop defect by the auxiliary electrode layer 124.

In some embodiments, as shown in FIGS. 3 to 10, the two substrates are a first substrate 11 and a second substrate 12. An insulating layer of the first substrate 11 is a pixel defining layer 115, and a conductive layer of the first substrate 11 is the transmissive electrode layer 114. An insulating layer of the second substrate 12 is a transparent adhesive layer 123, and a conductive layer of the second substrate 12 is the auxiliary electrode layer 124. Here, a base substrate included in the first substrate 11 is a first base substrate 111, and a base substrate included in the second substrate 12 is a second base substrate 121. Here, the display panel 1 provided by the embodiments of the present disclosure is a top-emitting display panel, and light-emitting units are disposed on the first substrate 11. The first substrate 11 corresponds to an array substrate, and the second substrate 12 corresponds to a cover plate.

For example, as shown in FIGS. 3, 5, 7 and 9, the plurality of grooves 14 are disposed in the pixel defining layer 115, and the plurality of support portions 13 are disposed on the transparent adhesive layer 123.

For example, as shown in FIGS. 4, 6, 8, and 10, the plurality of grooves 14 are disposed in the transparent adhesive layer 123, and the plurality of support portions 13 are disposed on the pixel defining layer 115.

The display panel 1 includes a plurality of open regions and a non-open region. In some embodiments, the plurality of grooves 14 and the plurality of support portions 13 are disposed in the non-open region, so as to avoid blocking light in the plurality of open regions.

Figure 4:
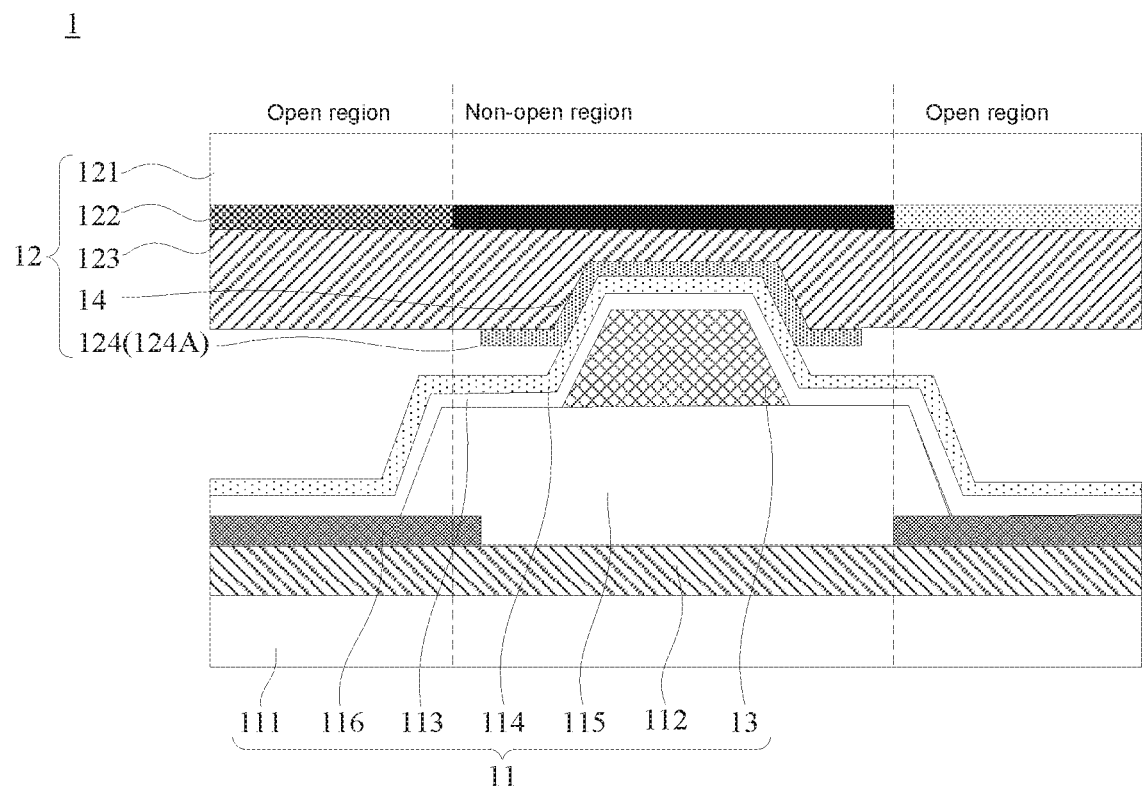
FIG. 4 is a schematic diagram showing a structure of yet another display panel, in accordance with some embodiments of the present disclosure.
Figure 5:
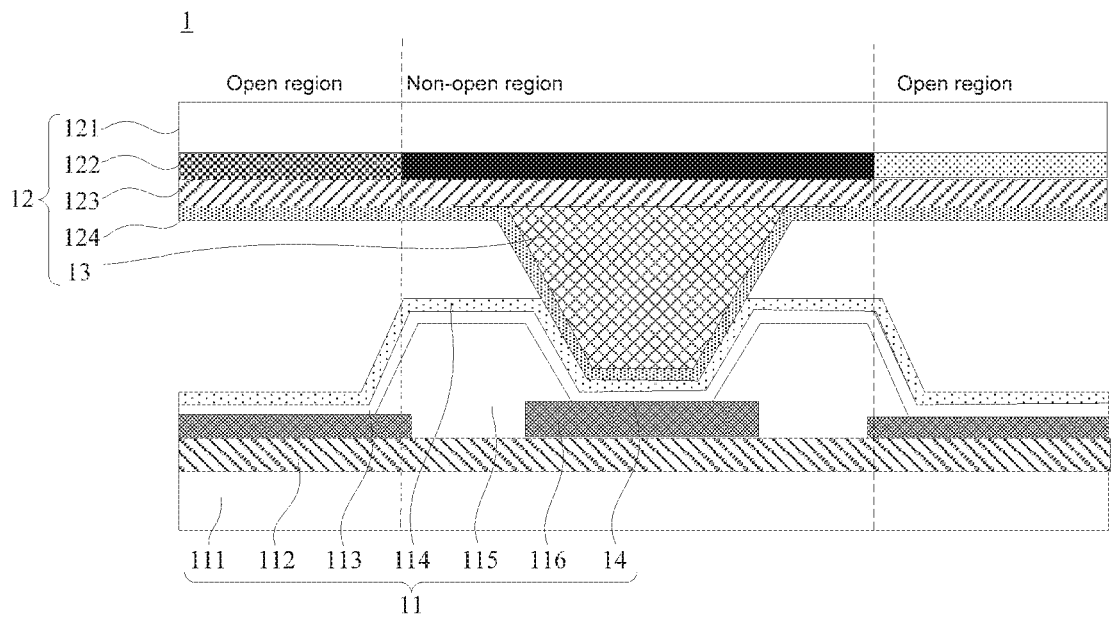
FIG. 5 is a schematic diagram showing a structure of yet another display panel, in accordance with some embodiments of the present disclosure.
Figure 6:
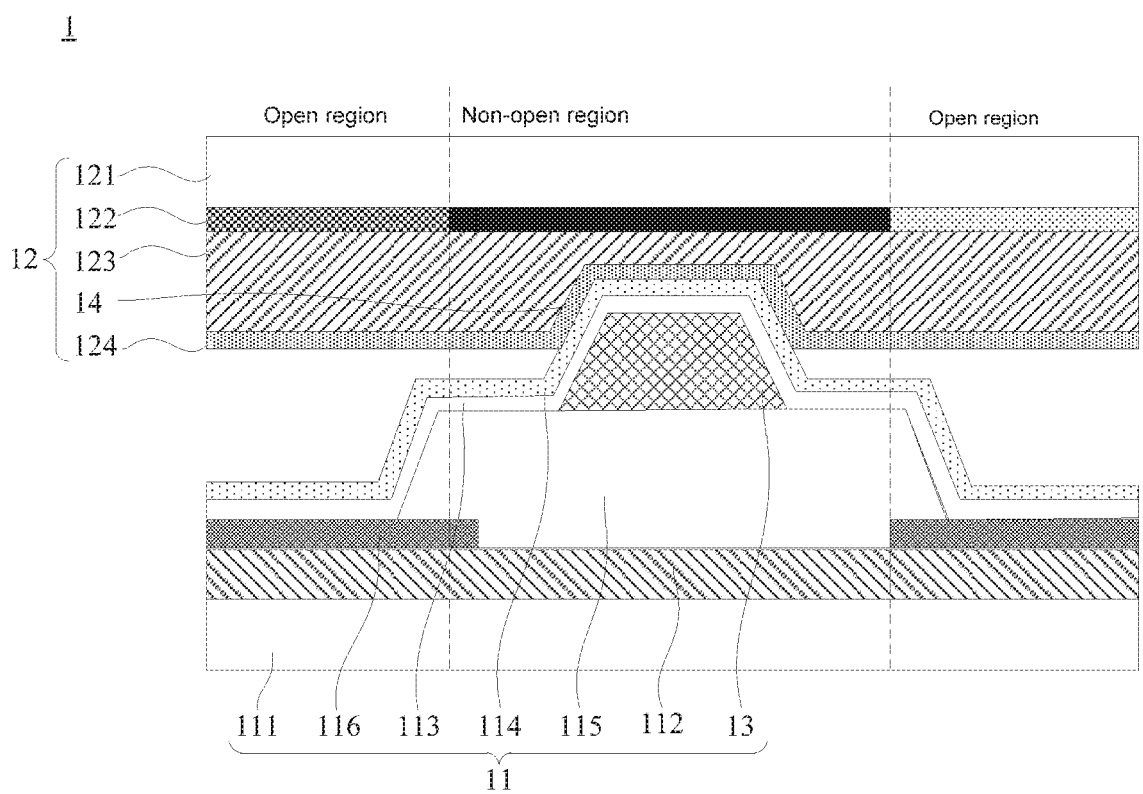
FIG. 6 is a schematic diagram showing a structure of yet another display panel, in accordance with some embodiments of the present disclosure.
Figure 10:
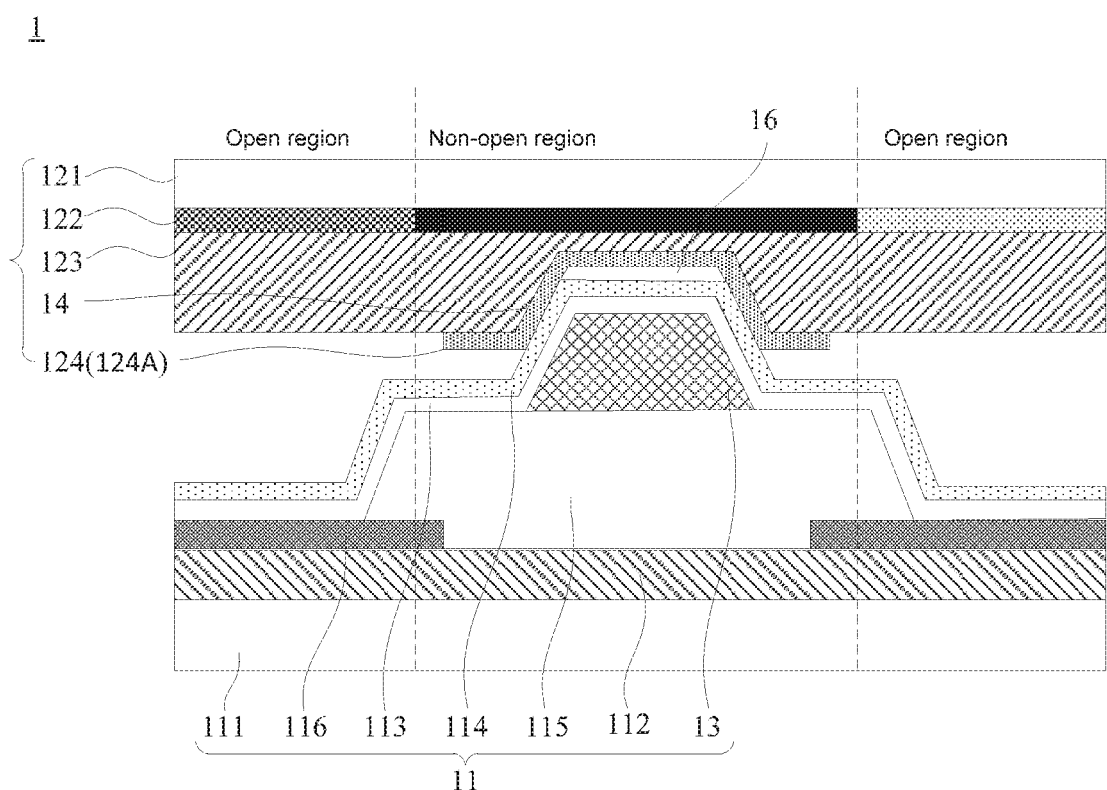
FIG. 10 is a schematic diagram showing a structure of yet another display panel, in accordance with some embodiments of the present disclosure.

In some examples, as shown in FIGS. 4 and 10, an insulating layer of a substrate to which the auxiliary electrode layer 124 belongs has the plurality of grooves 14, and the auxiliary electrode layer 124 includes a plurality of auxiliary electrodes 124A. The plurality of auxiliary electrodes 124A are respectively and correspondingly located in the plurality of grooves 14, and each auxiliary electrode 124A at least covers a bottom face of a corresponding groove 14.

In some other examples, as shown in FIGS. 5 to 8, the auxiliary electrode layer 124 is in both the plurality of open regions and the non-open region. For example, the auxiliary electrode layer 124 has a whole-layer structure. In this way, the auxiliary electrode layer 124 may be prevented from being patterned when the auxiliary electrode layer 124 is formed, thereby simplifying a process of the auxiliary electrode layer 124.

It will be noted that, each of the plurality of open regions is a light-transmitting region corresponding to a sub-pixel in the display panel 1. The non-open region is a region other than the open region of each sub-pixel in an entire display region of the display panel 1. The non-open region does not allow light to be transmitted. For example, the non-open region includes regions each between adjacent rows of sub-pixels and regions each between adjacent columns of sub-pixels.

In some embodiments, the auxiliary electrode layer 124 is located in the non-open region. Since the non-open region does not allow the light to be transmitted, the auxiliary electrode layer 124 may be made of a transparent conductive material or an opaque conductive material, such as metal or conductive metal oxide.

In some other embodiments, the auxiliary electrode layer 124 is in both the plurality of open regions and the non-open region. Since the open regions need to allow the light to be transmitted, the auxiliary electrode layer 124 needs to be made of the transparent conductive material, such as silver nanowires, graphene, graphene oxide, a composite of the silver nanowires and a transparent polymer material, a transparent conductive metal oxide such as ITO or IZO, or a transparent conductive polymer material.

In some embodiments, the auxiliary electrode layer 124 has flexibility. In this way, in a case where the auxiliary electrode layer 124 is in contact with the transmissive electrode layer 114, the auxiliary electrode layer 124 having the flexibility may reduce an interaction force between the auxiliary electrode layer 124 and the transmissive electrode layer 114 in the bonding process, and reducing the pressure between the auxiliary electrode layer 124 and the transmissive electrode layer 114, thereby avoiding problems of abrasion and fracture of the transmissive electrode layer 114 and/or the auxiliary electrode layer 124 caused by an excessive pressure between the auxiliary electrode layer 124 and the transmissive electrode layer 114.

In addition, the auxiliary electrode layer 124 will be slightly deformed after being stressed in the bonding process, and an elastic force generated due to a recovery of the auxiliary electrode layer 124 may make bonding between the auxiliary electrode layer 124 and the transmissive electrode layer 114 tighter, thereby further improving the defect of excessive contact resistance caused by the poor contact between the auxiliary electrode layer 124 and the transmissive electrode layer 114.

On the basis of such a design in which the auxiliary electrode layer 124 has the flexibility, a material of the auxiliary electrode layer 124 is not specifically limited, as long as a conductive material having flexibility is used. In some examples, the auxiliary electrode layer 124 is located in the non-open region. In this case, the material of the auxiliary electrode layer 124 may be a transparent flexible conductive material or an opaque flexible conductive material, such as the silver nanowires, the graphene, the graphene oxide, the composite of the silver nanowires and the transparent polymer material, a composite of the silver nanowires and the graphene oxide, or the transparent conductive polymer material. In some other examples, the auxiliary electrode layer 124 may be in all the plurality of open regions and the non-open region. In this case, the auxiliary electrode layer 124 needs to be made of the transparent flexible conductive material, such as the silver nanowires, the graphene, the graphene oxide, the composite of the silver nanowires and the transparent polymer material, or the transparent conductive polymer material.

Figure 7:
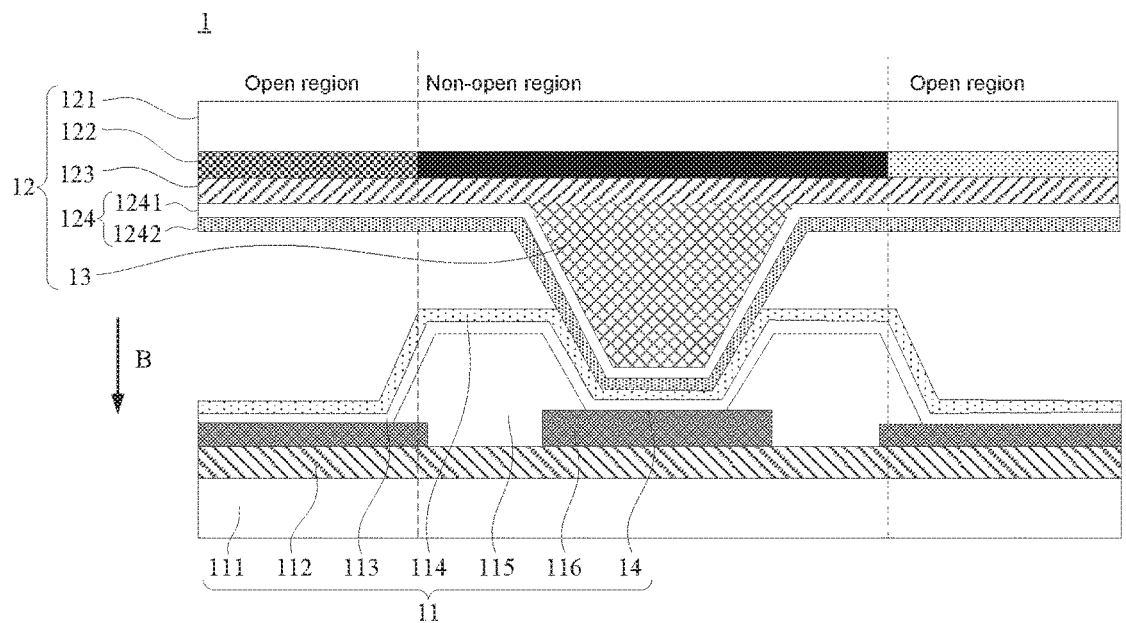
FIG. 7 is a schematic diagram showing a structure of yet another display panel, in accordance with some embodiments of the present disclosure.
Figure 8:
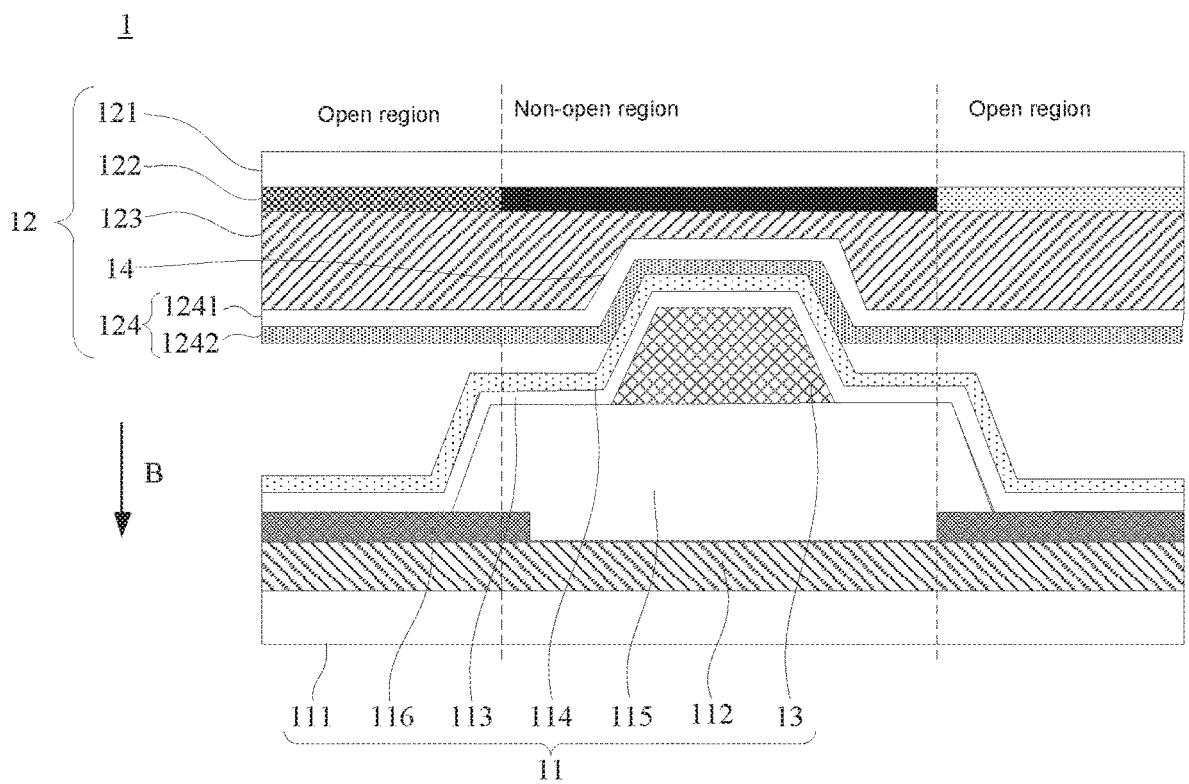
FIG. 8 is a schematic diagram showing a structure of yet another display panel, in accordance with some embodiments of the present disclosure.

In some embodiments, as shown in FIGS. 7 and 8, the auxiliary electrode layer 124 includes at least one first sub-layer 1241 and at least one second sub-layer 1242 that are disposed in a stack. In a direction perpendicular to a base substrate where the auxiliary electrode layer 124 is located and pointing from the base substrate to the opposite base substrate (shown by the direction indicator arrow B in FIG. 7 or FIG. 8), a last sub-layer in the at least one first sub-layer 1241 and the at least one second sub-layer 1242 is a second sub-layer 1242. A material of the first sub-layer 1241 includes a conductive material, and a material of the second sub-layer 1242 includes a flexible conductive material.

The auxiliary electrode layer 124 includes a plurality of sub-layers disposed in a stack. In this way, a chemical bond connection may be formed between adjacent sub-layers through an interaction between the adjacent sub-layers, thereby reducing a resistance of the auxiliary electrode layer 124, and reducing the IR-drop better.

Moreover, since the second sub-layer 1242 made of the flexible conductive material is in contact with the transmissive electrode layer 114, the second sub-layer 1242 having the flexibility may reduce the interaction force between the auxiliary electrode layer 124 and the transmissive electrode layer 114 in the bonding process, thereby avoiding the problems of abrasion and fracture of the transmissive electrode layer 114 and/or the auxiliary electrode layer 124.

In addition, since the first sub-layer 1241 does not directly contact the transmissive electrode layer 114, the material of the first sub-layer 1241 may be a flexible conductive material or a non-flexible conductive material, which allows the material of the first sub-layer 1241 to be a material with high conductivity but high hardness, thereby further reducing the contact resistance between the transmissive electrode layer 114 and the auxiliary electrode layer 124, and expanding a selection range of the material of the first sub-layer 1241.

In some embodiments, the at least one first sub-layer 1241 and the at least one second sub-layer 1242 are alternately stacked. In a first sub-layer 1241 and a second sub-layer 1242 that are adjacent, an orthographic projection of the second sub-layer 1242 on the base substrate where the auxiliary electrode layer 124 is located covers an orthographic projection of the first sub-layer 1241 on the base substrate where the auxiliary electrode layer 124 is located.

For example, as shown in FIGS. 7 and 8, the auxiliary electrode layer 124 includes one first sub-layer 1241 and one second sub-layer 1242. The second sub-layer 1242 is disposed on a side of the first sub-layer 1241 away from the transparent adhesive layer 123. An orthographic projection of the second sub-layer 1242 on the base substrate where the auxiliary electrode layer 124 is located covers an orthographic projection of the first sub-layer 1241 on the base substrate where the auxiliary electrode layer 124 is located.

On the basis of a design in which the at least one first sub-layer 1241 and the at least one second sub-layer 1242 are alternately stacked, in some embodiments, the material of each first sub-layer 1241 includes the silver nanowires, and the material of each second sub-layer 1242 includes the graphene oxide. A sequence of forming a silver nanowire layer and a graphene oxide layer is to first form the silver nanowire layer (i.e., the first sub-layer 1241), and then to form the graphene oxide layer (i.e., the second sub-layer 1242). In this way, a chemical bond connection may be formed between the silver nanowire layer and the graphene oxide layer through an interaction force between the silver nanowire layer and the graphene oxide layer, thereby reducing sheet resistances of the film layers.

Not only that, the silver nanowires and the graphene oxide are both the flexible conductive materials. In the first sub-layer 1241 and the second sub-layer 1242 that are adjacent, the orthographic projection of the second sub-layer 1242 on the base substrate where the auxiliary electrode layer 124 is located covers the orthographic projection of the first sub-layer 1241 on the base substrate where the auxiliary electrode layer 124 is located. In this way, the second sub-layer 1242 including the graphene oxide may cover the first sub-layer 1241 including the silver nanowires, and the contact area between the first sub-layer 1241 and the second sub-layer 1242 is greatly increased. Therefore, a resistance between the film layers is effectively reduced, and the graphene oxide layer may protect the silver nanowires to prevent the silver nanowires from being oxidized, and an auxiliary electrode layer 124 having excellent ductility and excellent flexibility may be obtained.

In some examples, a method for forming the first sub-layer 1241 and the second sub-layer 1242 that are adjacent is: preparing silver nanowire dispersion liquid through a polyol reduction process, in which a reaction temperature is controlled to be in a range of 100° C. to 120° C.; after silver nanowire solution is ultrasonically dispersed, coating the dispersed silver nanowire solution on the base substrate by using a process such as a Meyer rod coating process, a spray coating process, a screen printing process or a spin coating process, and vacuum drying the silver nanowire solution in a range of 80° C. to 120° C. to form the silver nanowire layer as the first sub-layer 1241; and forming the graphene oxide layer through a chemical vapor deposition (CVD) method, the spray coating process or the spin coating process as the second sub-layer 1242 on the base substrate on which the silver nanowire layer has been formed.

In some other embodiments, the material of each first sub-layer 1241 includes the composite of the silver nanowires and the transparent polymer material, and the material of each second sub-layer 1242 includes the graphene oxide. In this way, by adding the transparent polymer material into each first sub-layer 1241, the flexibility of the first sub-layer 1241 is improved, and a protective layer may also be formed on the silver nanowires to prevent the silver nanowires from being oxidized.

Here, the transparent polymer material included in each first sub-layer 1241 may be a non-conductive, highly transparent material such as epoxy resin and acrylic resin, or may be an electron-type transparent conductive polymer material such as polyaniline, polypyrrole, polythiophene, and poly (3,4-ethylenedioxythiophene).

In some examples, a method for forming each first sub-layer 1241 including the composite of the silver nanowires and the transparent polymer material is: preparing a mixed solution of the silver nanowires and the transparent polymer material, and forming a corresponding layer on the base substrate by using the spin coating process or the spray coating process. In some other examples, the method for forming the first sub-layer 1241 including the composite of the silver nanowires and the transparent polymer material includes: firstly forming a silver nanowire film on the base substrate, and then placing the base substrate on which the silver nanowire film has been formed in a reaction gas environment of the transparent polymer material to form a layer in which the transparent polymer material covers the silver nanowires.

In yet some other embodiments, the material of each first sub-layer 1241 includes the composite of the silver nanowires and the graphene oxide, and the material of each second sub-layer 1242 includes the graphene oxide and/or the transparent conductive polymer material. That is, the material of each second sub-layer 1242 includes the graphene oxide, the transparent conductive polymer material, or a composite of the graphene oxide and the transparent conductive polymer material. The silver nanowires are good electrical conductors, and may ensure a good electrical contact between the auxiliary electrode layer 124 and the transmissive electrode layer 114. The graphene oxide, the silver nanowires, and the conductive polymer material all have good flexibility, and thus may reduce the pressure and friction between the auxiliary electrode layer 124 and the transmissive electrode layer 114 when the first substrate 11 and the second substrate 12 are bonded. In addition, the conductive polymer material may ensure a close connection between the auxiliary electrode layer 124 and the transmissive electrode layer 114, and reduce the contact resistance between the auxiliary electrode layer 124 and the transmissive electrode layer 114.

Here, for example, the method for forming the first sub-layer 1241 and the second sub-layer 1242 that are adjacent is: first forming a composite layer of the graphene oxide and the silver nanowires (the composite layer including the composite of the graphene oxide and the silver nanowires) as the first sub-layer 1241; and forming the second sub-layer 1242 including the graphene oxide and/or the transparent conductive polymer material by means of coating or printing. As some possible designs, a material of a transparent conductive polymer layer is at least one of the polyaniline, the polypyrrole, the polythiophene, the poly(3, 4-ethylenedioxythiophene), or other electron-type transparent conductive materials.

In some embodiments, as shown in FIG. 2, in the display panel 1, in the direction perpendicular to the substrate to which the plurality of grooves 14 belong (shown by the direction indicator arrow A in FIG. 2), the depth $D_4$ of each groove 14 is less than a sum of a height $D_1$ of a corresponding support portion 13, a thickness $D_3$ of the conductive layer covering the corresponding support portion 13, and a thickness $D_2$ of the conductive layer covering the groove 14. In this way, after the substrate where the plurality of grooves 14 are located and the substrate where the plurality of support portions 13 are located are bonded, there is still a certain gap between the two substrates to ensure that the substrate where the plurality of grooves 14 are located and the substrate where the plurality of support portions 13 are located do not contact each other in the bonding process, thereby preventing the two substrates from being damaged due to the fact that the two substrates are pressed against each other in the bonding process.

If the gap between the substrate where the plurality of grooves 14 are located and the substrate where the plurality of support portions 13 are located is too large, a thickness of the display panel 1 formed after the two substrates are bonded will be very large. Therefore, in some embodiments, the depth $D_4$ of each groove 14 ranges from 0.5 times to 0.8 times the sum of the height $D_1$ of the corresponding support portion 13, the thickness $D_3$ of the conductive layer covering the corresponding support portion 13, and the thickness $D_2$ of the conductive layer covering the groove 14. In this way, not only the two substrates are prevented from being damaged due to the fact that the two substrates are pressed against each other in the bonding process, but also the thickness of the display panel 1 formed after the two substrates are bonded is ensured not to be too large.

In order to make each support portion 13 easy to be embedded into a corresponding groove 14, in some embodiments, in a direction perpendicular to the substrate to which the plurality of grooves 14 belong and pointing from the substrate to the opposite substrate (shown by the direction indicator arrow B in FIG. 3), a width of each groove 14 (shown by W in FIG. 3) is gradually increased. The width of each groove 14 is a size of the groove 14 in a direction parallel to the substrate where the groove 14 is located. In this way, when the two substrates are bonded, each support portion 13 may be easily embedded into a corresponding groove 14.

In addition, in some embodiments, a shape and a size of a portion of each support portion 13 embedded into a corresponding groove 14 are matched with a shape and a size of the corresponding groove 14 respectively. In this way, it may be ensured that after the support portion 13 is embedded into the corresponding groove 14, the conductive layer covering the support portion 13 is in close contact with the conductive layer covering the corresponding groove 14.

For example, in the direction perpendicular to the substrate to which the plurality of grooves 14 belong, a cross-section of each groove 14 has a shape of a trapezoid or a semicircle. Moreover, in the direction perpendicular to the substrate to which the plurality of grooves 14 belong and pointing from the substrate to the opposite substrate (shown by the direction indicator arrow B in FIG. 3), a size of the trapezoid or the semicircular in the direction parallel to the substrate to which the plurality of grooves 14 belong (shown by W in FIG. 3) is gradually increased.

In some other embodiments, in the direction perpendicular to the substrate to which the plurality of grooves 14 belong, the cross-section of each groove 14 has a rectangular shape or other shapes. The embodiments of the present disclosure do not limit this, as long as the conductive layer covering each support portion 13 may be in contact with the conductive layer covering a corresponding groove 14 in a case where the support portion 13 is embedded into the corresponding groove 14.

Figure 9:
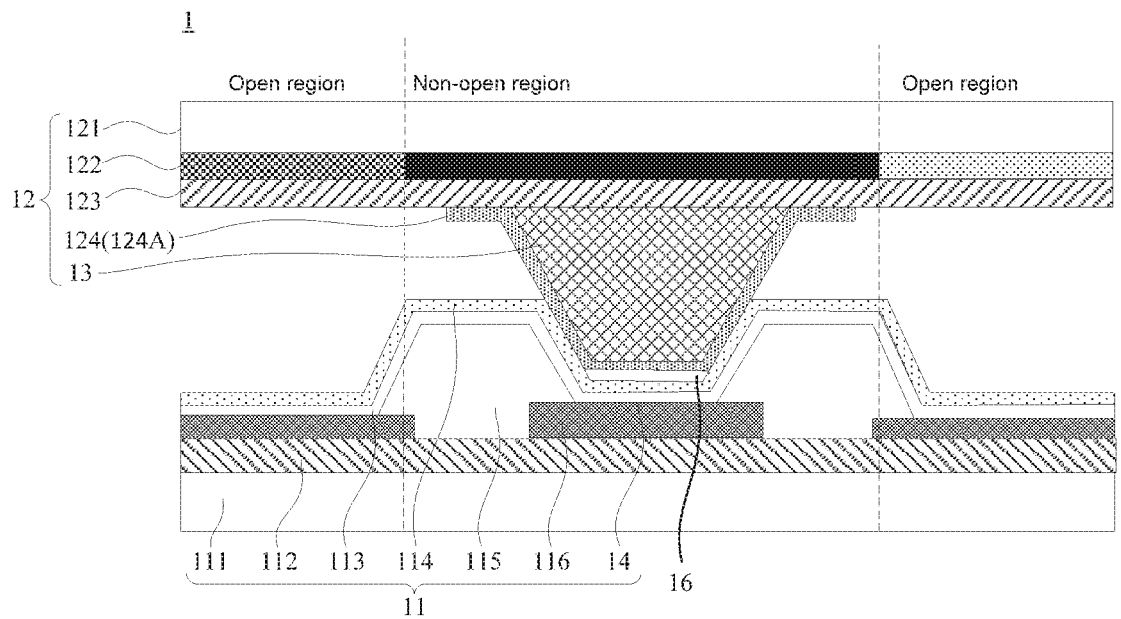
FIG. 9 is a schematic diagram showing a structure of yet another display panel, in accordance with some embodiments of the present disclosure.

In some embodiments, as shown in FIGS. 2, 9 and 10, the substrate having the plurality of grooves 14 in the two substrates further includes a plurality of buffer electrodes 16 disposed on a side of the conductive layer of the substrate away from the base substrate of the substrate. The plurality of buffer electrodes 16 are respectively and correspondingly disposed in the plurality of grooves 14, and the plurality of buffer electrodes have flexibility.

On the basis of the above design, in some possible implementations, the two substrates are the first substrate 11 and the second substrate 12. The insulating layer of the first substrate 11 is the pixel defining layer 115, and the conductive layer of the first substrate 11 is the transmissive electrode layer 114. The insulating layer of the second substrate 12 is the transparent adhesive layer 123, and the conductive layer of the second substrate 12 is the auxiliary electrode layer 124. For example, referring to FIG. 9, the plurality of grooves 14 are disposed in the pixel defining layer 115 of the first substrate 11, and the plurality of buffer electrodes 16 are respectively and correspondingly disposed in the plurality of grooves 14. For another example, referring to FIG. 10, the plurality of grooves 14 are disposed in the transparent adhesive layer 123 of the second substrate 12, and the plurality of buffer electrodes 16 are respectively and correspondingly disposed in the plurality of grooves 14.

In this way, in a case where the auxiliary electrode layer 124 is in contact with the transmissive electrode layer 114 through the plurality of buffer electrodes 16, the plurality of buffer electrodes 16 having the flexibility may reduce the interaction force between the auxiliary electrode layer 124 and the transmissive electrode layer 114 in the bonding process, and reduce the pressure between the auxiliary electrode layer 124 and the transmissive electrode layer 114, thereby avoiding the problems of abrasion and fracture of the transmissive electrode layer 114 and/or the auxiliary electrode layer 124 caused by the excessive pressure between the auxiliary electrode layer 124 and the transmissive electrode layer 114 in the bonding process of the two substrates.

In some embodiments, a material of each buffer electrode 16 includes a carbon nanomaterial and/or a silver nanomaterial. Since both the carbon nanomaterial and the silver nanomaterial have good electrical conductivity, each buffer electrode 16 enables the transmissive electrode layer 114 to be better electrically connected to the auxiliary electrode layer 124, thereby reducing the resistance between the transmissive electrode layer 114 and the auxiliary electrode layer 124.

Further, the material of each buffer electrode 16 further includes a conductive polymer resin material. Since the conductive polymer resin material has better elasticity, the plurality of buffer electrodes 16 may better reduce the interaction force between the auxiliary electrode layer 124 and the transmissive electrode layer 114 in the bonding process, and enable the transmissive electrode layer 114 to be better electrically connected to the auxiliary electrode layer 124 at the same time, thereby further avoiding the problems of abrasion and fracture of the transmissive electrode layer 114 and/or the auxiliary electrode layer 124 caused by the excessive pressure between the auxiliary electrode layer 124 and the transmissive electrode layer 114 in the bonding process of the two substrates.

In some embodiments, as shown in FIGS. 3 to 10, the first substrate 11 is further provided with an anode layer 116, an electroluminescent layer 113, and a thin film transistor layer 112. The thin film transistor layer 112 is disposed on a side of the first base substrate 111 proximate to the second base substrate 121. The anode layer 116 is disposed on a side of the thin film transistor layer 112 away from the first base substrate 111. The electroluminescent layer 113 is disposed on a side of the anode layer 116 away from the thin film transistor layer 112.

The thin film transistor layer 112 includes a plurality of thin film transistors respectively corresponding to a plurality of sub-pixels of the display panel 1. The pixel defining layer 115 has a plurality of openings respectively corresponding to the plurality of sub-pixels of the display panel 1, i.e., respectively corresponding to the plurality of open regions of the display panel 1. The anode layer 116 includes a plurality of anodes respectively corresponding to the plurality of open regions. The plurality of thin film transistors are electrically connected to the plurality of anodes respectively and correspondingly, and each thin film transistor is used to drive a corresponding anode that is electrically connected to the thin film transistor.

In some possible designs, the electroluminescent layer 113 is a light-emitting layer capable of emitting white light. In this case, the electroluminescent layer 113 has a whole-layer structure. In this case, the second substrate 12 further includes a color filter layer 122. The color filter layer 122 includes a plurality of red filter films R, a plurality of green filter films G, and a plurality of blue filter films B. After the white light emitted from the electroluminescent layer 113 passes through the plurality of red filter films R, the plurality of green filter films G, and the plurality of blue filter films B, red light, green light and blue light are respectively produced.

The second substrate 12 further includes a black matrix 1224. The black matrix 1224 has a plurality of holes respectively corresponding to the plurality of open regions of the display panel 1. An orthographic projection of the black matrix 1224 on the second base substrate 121 of the second substrate 12 covers the non-open region of the display panel 1 to avoid a color mixture between two adjacent sub-pixels.

Figure 11:
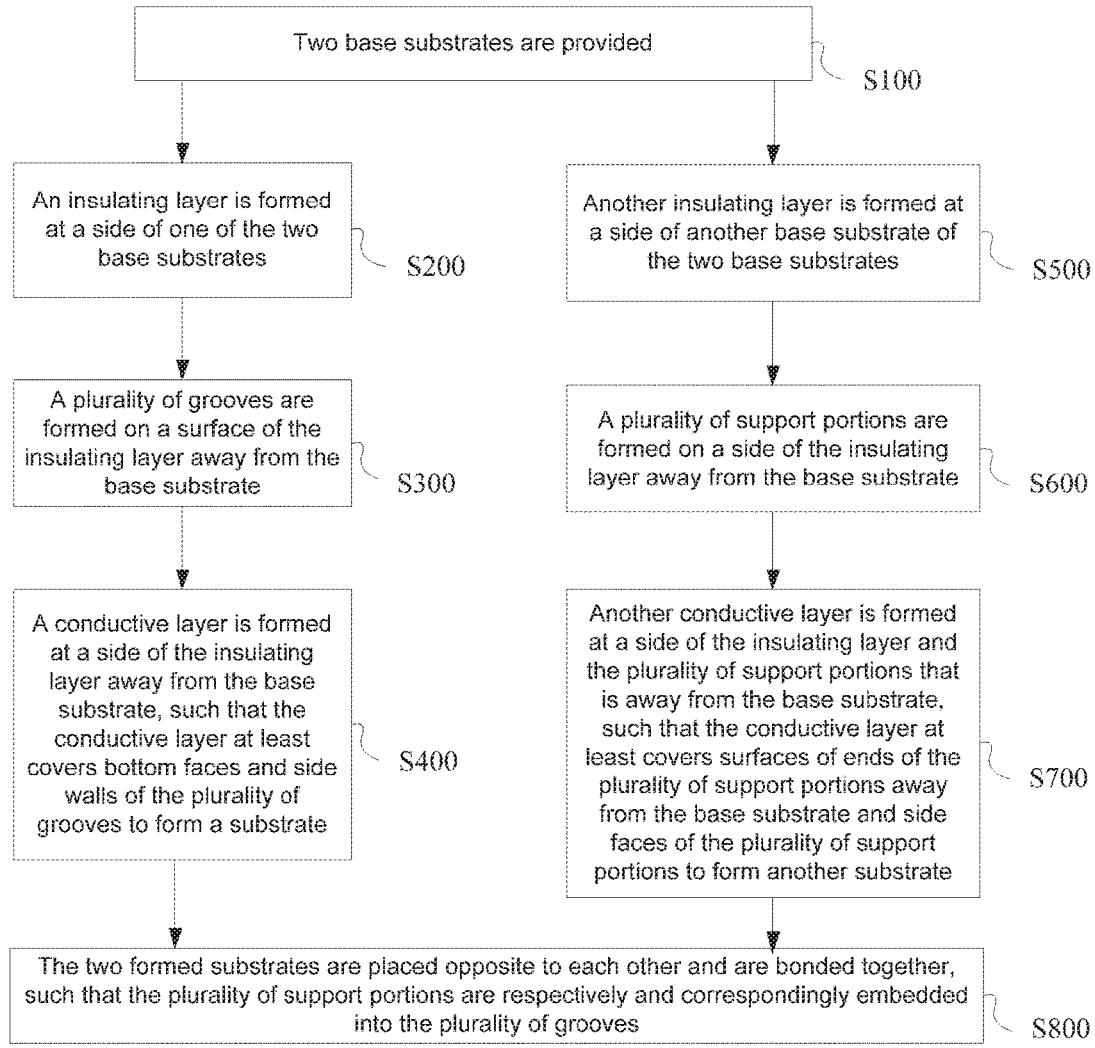
FIG. 11 is a flow diagram of a method for manufacturing a display panel, in accordance with some embodiments of the present disclosure.

Some embodiments of the present disclosure provide a method for manufacturing a display panel, which is configured to manufacture the display panel 1 according to the above embodiments. As shown in FIG. 11, the manufacturing method includes S100 to S800.

In S100, two base substrates are provided.

In S200, an insulating layer is formed at a side of one base substrate of the two base substrates.

In S300, a plurality of grooves are formed in a surface of the insulating layer away from the base substrate.

In S400, a conductive layer is formed at a side of the insulating layer away from the base substrate, such that the conductive layer at least covers bottom faces and side walls of the plurality of grooves to form a substrate.

In S500, another insulating layer is formed at a side of another base substrate of the two base substrates.

In S600, a plurality of support portions are formed on a side of the another insulating layer away from the another base substrate.

In S700, another conductive layer is formed at a side of the another insulating layer and the plurality of support portions that is away from the another base substrate, such that the another conductive layer at least covers surfaces of the plurality of support portions away from the another base substrate and side faces of the plurality of support portions to form another substrate.

In S800, the two formed substrates are placed opposite to each other and are bonded together, such that the plurality of support portions are respectively and correspondingly embedded into the plurality of grooves.

Here, S200 to S400 are a process for forming a substrate with the plurality of grooves, S500 to S700 are a process for forming a substrate with the plurality of support portions, and there is no sequential order between S200 to S400 and S500 to S700.

On this basis, the plurality of support portions are embedded into the corresponding plurality of grooves, such that the conductive layer that at least covers the bottom face and the side wall of each groove is in contact with the conductive layer that at least covers the surface of each support portion 13 proximate to the opposite substrate and the side face of the support portion. In this way, a contact area between the two conductive layers is increased, that is, the contact area between the auxiliary electrode layer and the transmissive electrode layer is increased. Moreover, not only the auxiliary electrode layer may well solve the IR-drop problem caused by the small thickness of the transmissive electrode layer, but also the pressure between the auxiliary electrode layer and the transmissive electrode layer is reduced, the probability of damage to the auxiliary electrode layer and/or the transmissive electrode layer is reduced, the poor contact between the auxiliary electrode layer and the transmissive electrode layer is avoided, and the effect of improving the IR-Drop defect by the auxiliary electrode layer is further strengthened.

In some embodiments, the method for manufacturing the display panel 1 includes the following process.

Figure 12:
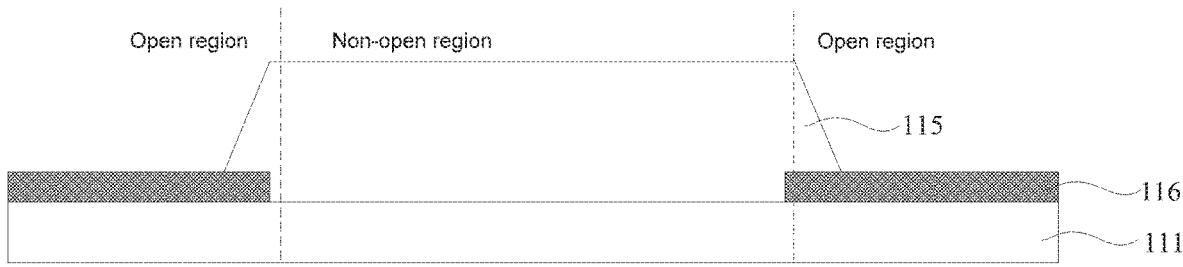
FIGS. 12-18 are schematic diagrams showing steps in a process of manufacturing a display panel, in accordance with some embodiments of the present disclosure.

As shown in FIG. 12, a first base substrate 111 is provided, and an anode layer 116 including a plurality of anodes is formed on the first base substrate 111. The anode layer 116 is made of a material capable of reflecting light, such as molybdenum, aluminum, silver, or other metals. A pixel-defining film with an photosensitizer added is coated at a side of the anode layer 116 away from the first base substrate 111, and the pixel-defining film is exposed and developed to form a plurality of openings in the pixel-defining film, thereby obtaining a pixel-defining layer 115.

Figure 13:
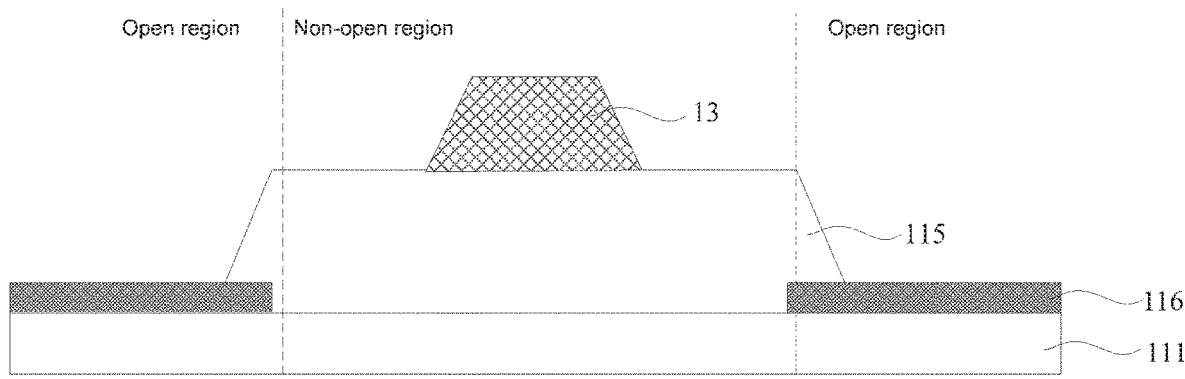

As shown in FIG. 13, a plurality of support portions 13 are formed on a side of the pixel defining layer 115 away from the first base substrate 111 through a patterning process.

Figure 14:
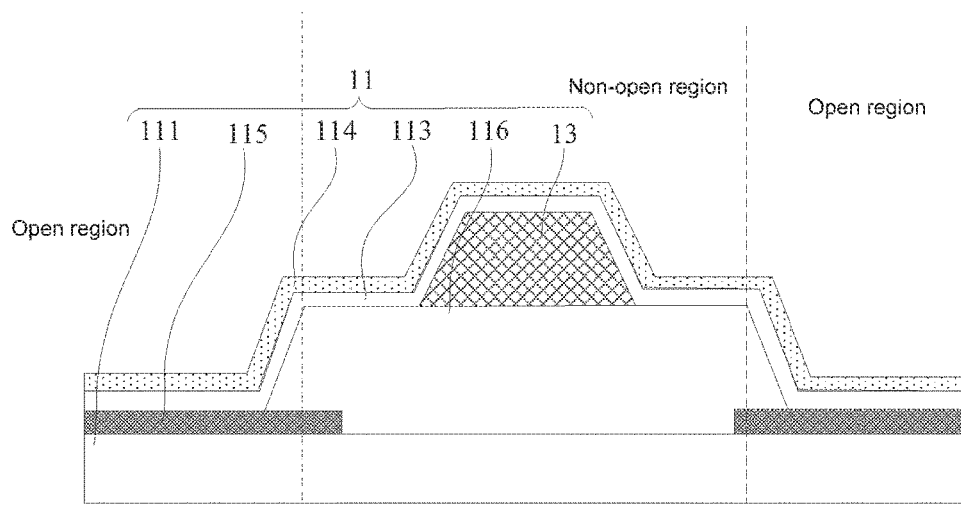

As shown in FIG. 14, an electroluminescent layer 113 and a transmissive electrode layer 114 are sequentially formed at a side of the pixel defining layer 115 and the plurality of support portions 13 that is away from the first base substrate 111 through a vacuum thermal evaporation process, thereby forming a first substrate 11. The transparent electrode layer 114 is made of a transparent conductive material, such as a transparent conductive metal oxide material such as ITO or IZO.

Figure 15:
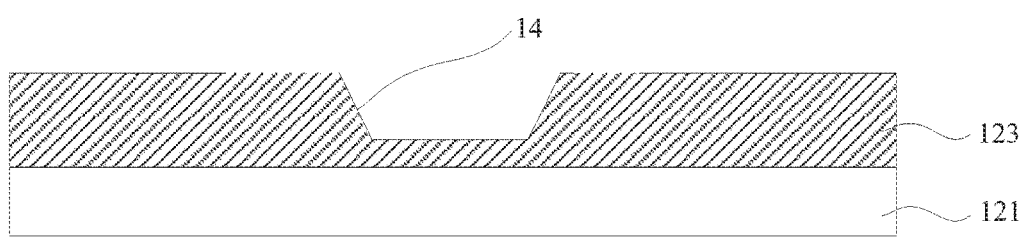

As shown in FIG. 15, a second base substrate 121 is provided. A transparent adhesive film with an photosensitizer added is coated on a side of the second base substrate 121, and the transparent adhesive film is exposed and developed to form a plurality of grooves 14 in the transparent adhesive film, thereby obtaining a transparent adhesive layer 123.

Figure 16:
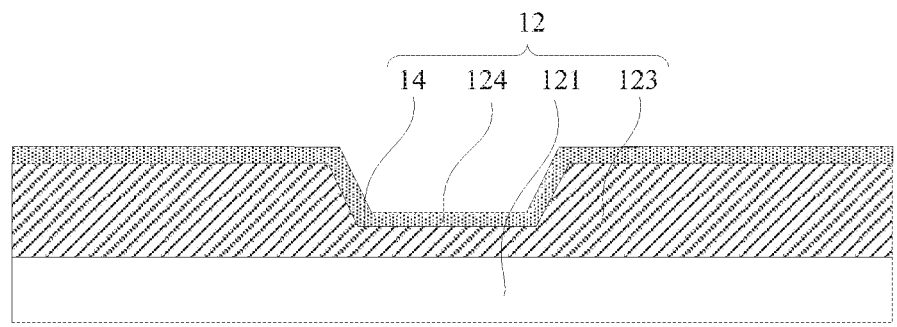

As shown in FIG. 16, an auxiliary electrode layer 124 is formed on a side of the transparent adhesive layer 123 away from the second base substrate 121 through a sputtering process.

Figure 17:
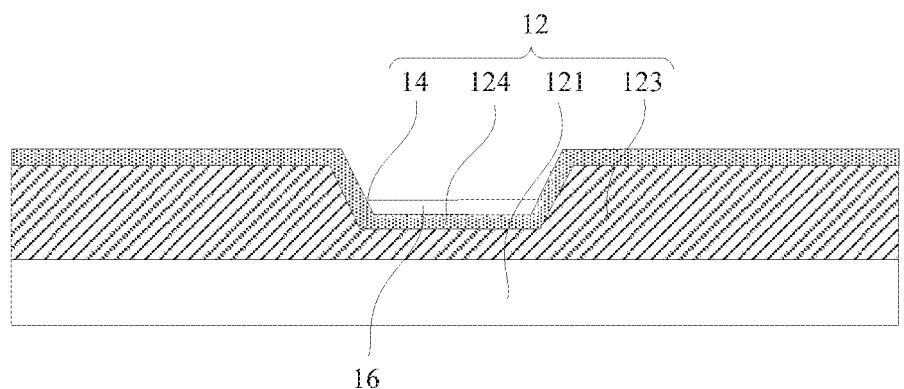

As shown in FIG. 17, a buffer electrode 16 is formed in each groove 14 through a coating process or a printing process, thereby forming a first substrate 12.

Figure 18:
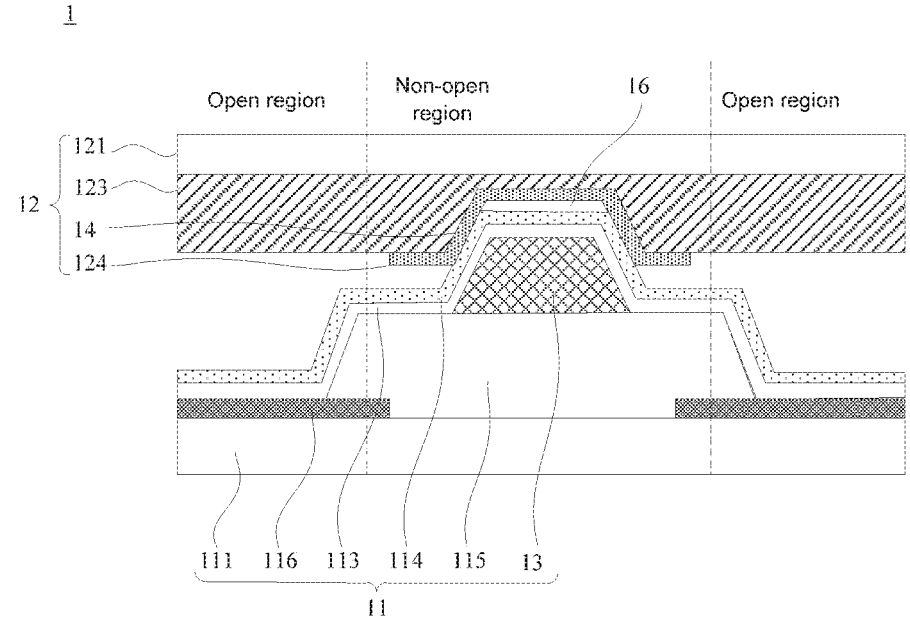

As shown in FIG. 18, the first substrate 11 and the second substrate 12 that are formed are placed opposite to each other and are bonded together, such that the plurality of support portions 13 are respectively and correspondingly embedded into the plurality of grooves 14. Here, in some possible designs, before the first substrate 11 and the second substrate 12 are bonded, an edge region of the first substrate 11 or an edge region of the second substrate 12 is coated with a frame sealant to ensure that the first substrate 11 is closely bonded to the second substrate 12.

It will be noted that, the above method for manufacturing the display panel is merely an example. In some other methods for manufacturing the display panel, the above manufacturing method may be correspondingly adjusted according to actual needs, which is not limited in the embodiments of the present disclosure.

Figure 19:
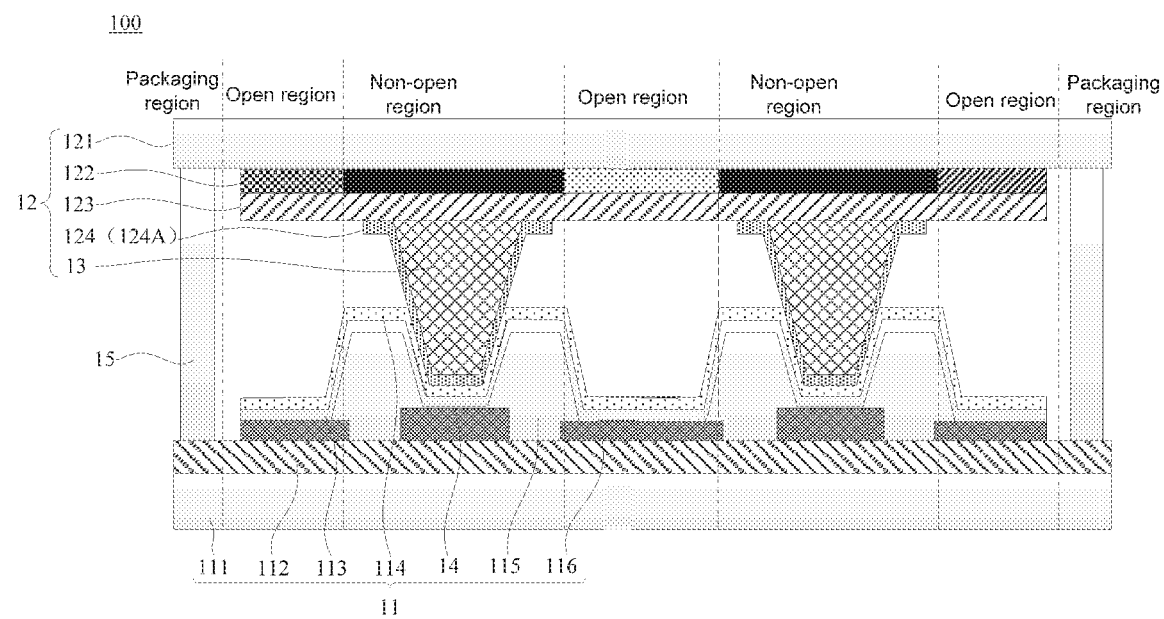
FIG. 19 is a schematic diagram showing a structure of a display device, in accordance with some embodiments of the present disclosure.

Some embodiments of the present disclosure provide a display device 100. As shown in FIG. 19, the display device 100 includes the display panel 1 according to the above embodiments. The display panel 1 includes the first substrate 11 and the second substrate 12. A frame sealant 15 is disposed between the first substrate 11 and the second substrate 12, and the frame sealant 15 is located in an edge region (i.e., a packaging region) of the display panel 1. The first substrate 11 and the second substrate 12 are bonded together through the frame sealant 15.

The display device may be any product or component having a display function such as an electronic paper, a mobile phone, a tablet computer, a television, a display, a notebook computer, a digital photo frame, or a navigator.

In the description of the above embodiments, specific features, structures, materials or characteristics may be combined in a suitable manner in any one or more embodiments or examples.

The foregoing descriptions are merely specific implementation manners of the present disclosure, but the protection scope of the present disclosure is not limited thereto. Changes or replacements that any person skilled in the art can conceive of within the technical scope of the present disclosure shall all be included in the protection scope of the present disclosure. Therefore, the protection scope of the present disclosure shall be subject to the protection scope of the claims.

What is claimed is:

1. A display panel, comprising:
a base substrate including a first surface;
another base substrate including a second surface disposed facing the first surface;
a first insulating layer disposed above the first surface of the base substrate, wherein a plurality of grooves are disposed in a surface of the first insulating layer away from the base substrate;
a first conductive layer disposed at a side of the first insulating layer away from the base substrate, wherein the first conductive layer at least cover bottom faces and side walls of the plurality of grooves;
a plurality of support portions disposed above the second surface of the another base substrate;
a second conductive layer disposed at a side of the plurality of support portions away from the another base substrate, wherein the second conductive layer at least covers surfaces of the plurality of support portions facing away from the another base substrate and side faces of the plurality of support portions, and
a plurality of buffer electrodes disposed on a side of the first conductive layer away from the base substrate, wherein each of the plurality of buffer electrodes is disposed in a respective one of the plurality of grooves, and the plurality of buffer electrodes have flexibility, wherein
each support portion is embedded into a respective one of the plurality of grooves, and the first conductive layer is in electrical contact with the second conductive layer at the bottom faces and side walls of the plurality of grooves.

2. The display panel according to claim 1, wherein one of the first conductive layer and the second conductive layer is a transmissive electrode layer, and another one of the first conductive layer and the second conductive layer is an auxiliary electrode layer; and the auxiliary electrode layer has flexibility.

3. The display panel according to claim 2, wherein the auxiliary electrode layer includes at least one first sub-layer and at least one second sub-layer that are disposed in a stack; and in the at least one first sub-layer and the at least one second sub-layer, a sub-layer farthest from a base substrate where the auxiliary electrode layer is located is a second sub-layer; and
a material of the at least one first sub-layer includes a conductive material, and a material of the at least one second sub-layer includes a flexible conductive material.

4. The display panel according to claim 3, wherein the at least one first sub-layer and the at least one second sub-layer are alternately stacked;
in a first sub-layer and a second sub-layer that are adjacent, an orthographic projection of the first sub-layer on the another base substrate is in a range of an orthographic projection of the second sub-layer on the another base substrate, wherein
a material of each first sub-layer includes silver nanowires, and a material of each second sub-layer includes graphene oxide; or
the material of each first sub-layer includes a composite of the silver nanowires and a transparent polymer material, and the material of each second sub-layer includes the graphene oxide; or
the material of each first sub-layer includes a composite of the silver nanowires and the graphene oxide, and the material of each second sub-layer includes at least one of the graphene oxide or a transparent conductive polymer material.

5. The display panel according to claim 2, wherein a material of the auxiliary electrode layer includes at least one of silver nanowires, graphene, graphene oxide, a composite of the silver nanowires and a transparent polymer material, a composite of the silver nanowires and the graphene oxide, or a transparent conductive polymer material.

6. The display panel according to claim 2, wherein the display panel has a plurality of open regions and a non-open region; and
the auxiliary electrode layer is disposed in the plurality of open regions and the non-open region.

7. The display panel according to claim 2, wherein the display panel has a plurality of open regions and a non-open region, and the plurality of grooves and the plurality of support portions are disposed in the non-open region;
the first conductive layer is the auxiliary electrode layer, and the auxiliary electrode layer includes a plurality of auxiliary electrodes, each of the plurality of auxiliary electrodes is disposed in a respective one of the plurality of grooves, and each auxiliary electrode at least covers a bottom face and a side wall of a corresponding groove.

8. The display panel according to claim 1, wherein a material of each buffer electrode includes a conductive polymer resin material and at least one of a carbon nanomaterial or a silver nanomaterial.

9. The display panel according to claim 1, wherein in a direction perpendicular to the first surface of the base substrate, a depth of each groove is less than a sum of a height of a corresponding support portion, a thickness of the second conductive layer and a thickness of the first conductive layer.

10. The display panel according to claim 9, wherein the depth of each groove ranges from 0.5 times to 0.8 times the sum of the height of the corresponding support portion, the thickness of the second conductive layer and the thickness of the first conductive layer.

11. The display panel according to claim 1, wherein a width of each groove is gradually increased in a direction perpendicular to the first surface and pointing from the first surface to the second surface, and the width of each groove is a size of the groove in a direction parallel to the first surface; and
a shape and a size of a portion of each support portion embedded into a corresponding groove are matched with a shape and a size of the corresponding groove, respectively.

12. The display panel according to claim 11, wherein a cross-section of each groove has a shape of a trapezoid or a semicircle in a direction perpendicular to the first surface.

13. A method for manufacturing the display panel according to claim 1, the method comprising:
providing two base substrates;
forming a first insulating layer at a side of one base substrate of the two base substrates;
forming a plurality of grooves in a surface of the first insulating layer away from the base substrate; and
forming a first conductive layer at a side of the first insulating layer away from the base substrate, the conductive layer at least covering bottom faces and side walls of the plurality of grooves; and
forming a buffer electrode on a side of the first conductive layer away from the base substrate in each groove to form a substrate; the buffer electrode having flexibility; and
forming a plurality of support portions at a side of another base substrate of the two base substrate; and
forming another conductive layer at a side of the plurality of support portions away from the another base substrate, the another conductive layer at least covering surfaces of the plurality of support portions facing away from the another base substrate and side faces of the plurality of support portions to form another substrate; and
placing the two substrates opposite to each other and bonding the two substrates together, such that each of the plurality of support portions is embedded into a respective one of the plurality of grooves.

14. The method according to claim 13, wherein before forming the plurality of support portions at a side of another base substrate of the two base substrate, the method further comprises:
forming a second insulating layer at a side of the another base substrate where the plurality of support portion are to be formed.

15. A display device, comprising the display panel according to claim 1.

16. The display panel according to claim 1, further comprising a second insulating layer disposed between the plurality of support portions and the another base substrate.

17. The display panel according to claim 16, wherein the first insulating layer is a pixel defining layer, and the first conductive layer is a transmissive electrode layer; and the second insulating layer is a transparent adhesive layer, and the second conductive layer is an auxiliary electrode layer; or
the second insulating layer is a pixel defining layer, and the second conductive layer is a transmissive electrode layer; and the first insulating layer is a transparent adhesive layer, and the first conductive layer is an auxiliary electrode layer.

* * * * *